United States Patent
Liu et al.

(10) Patent No.: US 8,225,183 B2
(45) Date of Patent: Jul. 17, 2012

(54) METHODS AND APPARATUS FOR SELECTIVE DATA RETENTION DECODING IN A HARD DISK DRIVE

(75) Inventors: Jingfeng Liu, Longmont, CO (US);
Shaohua Yang, Santa Clara, CA (US);
Hongwei Song, Longmont, CO (US);
Yuan Xing Lee, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 960 days.

(21) Appl. No.: 12/241,919

(22) Filed: Sep. 30, 2008

(65) Prior Publication Data

US 2010/0083075 A1  Apr. 1, 2010

(51) Int. Cl.
*H03M 13/00* (2006.01)
(52) U.S. Cl. ........................ 714/780; 714/776
(58) Field of Classification Search ............... 714/780, 714/776
See application file for complete search history.

(56) References Cited

U.S. PATENT DOCUMENTS

| | | | |
|---|---|---|---|
| 6,405,342 B1* | 6/2002 | Lee | 714/792 |
| 6,604,220 B1* | 8/2003 | Lee | 714/769 |
| 6,748,032 B1* | 6/2004 | Kim et al. | 375/340 |
| 6,982,659 B2* | 1/2006 | Shen et al. | 341/50 |
| 7,231,577 B2* | 6/2007 | Richardson et al. | 714/758 |
| 2004/0022336 A1* | 2/2004 | Yu et al. | 375/346 |
| 2004/0168114 A1* | 8/2004 | Richardson et al. | 714/758 |

FOREIGN PATENT DOCUMENTS

EP  0 718 842  6/1996

OTHER PUBLICATIONS

Yeo et al., "VLSI Architectures for Iterative Decoders in Magnetic Recording Channels," IEEE Transactions on Magnetics, vol. 37, No. 2, pp. 748-755 (Mar. 2001).
Gunnam et al. Next Generation Iterative LDPC solutions for magnetic recording storage, Signals, Systems and Computers, 2008 42nd Asilomar Conference on, IEEE, Piscataway, NJ, USA, Oct. 26, 2008 pp. 1148-1152, XP031475470 ISBN: 978-1-4244-2940-0.
Engling et al., VLSI Architectures for Iterative Decoders in Magnetic Recording Channels, IEEE Transactions on Magnetics, IEEE Service Center, New York, NY, US LNKD-DOI: 10.1109/20.917611, vol. 37, No. 2, Mar. 1, 2001, pp. 748-755, XP002958229 ISSN: 0018-9464.

* cited by examiner

*Primary Examiner* — M. Mujtaba K Chaudry
(74) *Attorney, Agent, or Firm* — Ryan, Mason & Lewis, LLP

(57) ABSTRACT

Methods and apparatus are provided for improved physical re-read operations in a hard disk drive. The disclosed methods and apparatus selectively retain data in a hard disk drive. A signal is read in an iterative read channel by assigning a reliability metric to each of a plurality of segments in a read signal; repeating the assigning step for a plurality of read operations; and selectively retaining the segments based on the assigned reliability metric. The read signal can be obtained by positioning a transducer over a storage media. The reliability metric may be based on soft bit decisions; log likelihood ratios or a noise estimation of a given segment.

20 Claims, 2 Drawing Sheets

METHODS AND APPARATUS FOR SELECTIVE DATA RETENTION DECODING IN A HARD DISK DRIVE

FIELD OF THE INVENTION

The present invention is related to techniques for re-try operations in a hard disk drive and, more particularly, to techniques for physical re-read operations in such hard disk drives.

BACKGROUND OF THE INVENTION

In storage systems, as tracks and sectors are spaced closer together and as the spin rates produced by the spindle motor are increased, the likelihood of an error occurring while reading the storage media increase significantly. Storage systems employ a number of different techniques to eliminate or reduce such errors that may occur when reading data from a storage media. Most error detection and correction techniques in storage systems employ redundant information and special hardware. Error correction codes, for example, such as Low Density Parity Check (LDPC) codes, are often used to detect and correct such errors. LDPC codes are block codes based on a parity check matrix, H. See, for example, R. G. Gallagher, "Low-Density Parity-Check Code," IEEE Trans. Inform. Theory, vol. IT-8, 21-28 (January 1962).

When an error is encountered during a read operation, a retry operation is typically implemented, whereby a signal may be re-read from a buffer or from the storage media itself (or both). When a reread operation is performed from the storage media, the operating conditions may be varied, for example, by repositioning the transducer, to obtain a different signal. The reread operations typically continue until the erroneous data is correctly read from the storage media or until a predefined number of retry operations have been performed.

In one existing retry technique, an "on-the-fly" soft channel detector performs the initial read operation. If the "on-the-fly" detector encounters an error, a second soft channel detector may process buffered samples to perform an electronic retry that typically employs additional iterations than the "on-the-fly" detector. If the electronic retry fails, a physical re-read operation will be initiated, whereby the transducer is repositioned over the target area to obtain a new signal.

A need exists for improved physical re-read operations in a hard disk drive. A further need exists for improved methods and apparatus for selective data retention decoding in a hard disk drive.

SUMMARY OF THE INVENTION

Generally, methods and apparatus are provided for improved physical re-read operations in a hard disk drive. According to one aspect of the invention, the disclosed methods and apparatus selectively retain data in a hard disk drive. A signal is read in an iterative read channel by assigning a reliability metric to each of a plurality of segments in a read signal; repeating the assigning step for a plurality of read operations; and selectively retaining the segments based on the assigned reliability metric. For example, the read signal can be obtained by positioning a transducer over a storage media.

The reliability metric may be based on, for example, soft bit decisions associated with a given segment; log likelihood ratios associated with a given segment; or a noise estimation of a given segment. The noise estimation can be obtained, for example, by subtracting a reference signal from the segments.

A more complete understanding of the present invention, as well as further features and advantages of the present invention, will be obtained by reference to the following detailed description and drawings.

DETAILED DESCRIPTION

The present invention provides improved techniques for physical re-read operations in a hard disk drive. According to one aspect of the present invention, during a physical re-read operation, the hard disk drive can selectively retain the most reliable signal segments from among multiple read operations. In one exemplary embodiment, a reliability metric assigned to each segment identifies the most reliable signal segments.

Figure 1:
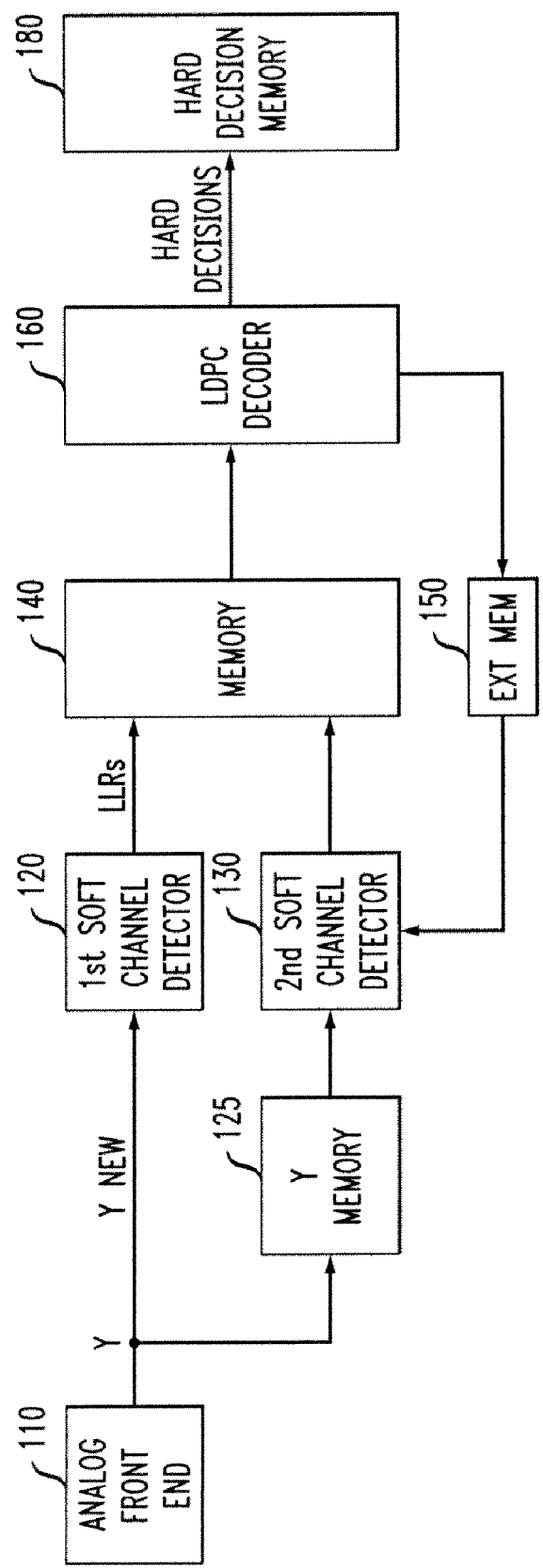
FIG. 1 is a schematic block diagram of an exemplary conventional LDPC code based iterative hard disk drive.

FIG. 1 is a schematic block diagram of an exemplary conventional LDPC code based iterative hard disk drive 100. As shown in FIG. 1, an analog front end 110 generates equalized samples, Y. For example, the equalized samples, Y, may be obtained after a finite impulse response (FIR) filtering. For a detailed discussion of conventional iterative decoding techniques, see for example, E. Yeo et al., "VLSI Architectures for Iterative Decoders in Magnetic Recording Channels," IEEE Trans. on Magnetics, Vol. 37, No. 2, March 2001, incorporated by reference herein.

A first soft channel detector 120, often referred to as an "on-the-fly" detector, processes the equalized samples, referred to as $Y_{New}$, and generates a series of reliability information for each Y sample in the form of soft bit decisions, such as log likelihood ratios (LLRs). The LLR values are written to a memory 140 and processed by an LPDC decoder 160, in a known iterative manner, to generate hard decisions that are stored in a memory 180. Generally, a hard bit decision is obtained based on the sign of the LLR value. Likewise, the magnitude of the LLR value provides an indication of the reliability of the decision.

As previously indicated, if the on-the-fly detection fails, a second soft channel detector 130 will process the buffered Y samples, obtained from a memory 125, to perform an electronic retry operation. The electronic retry operation typically comprises more iterations between the second soft channel detector 130 and the LPDC decoder 160 than employed by the first soft channel detector 120 during the on-the fly detection. As shown in FIG. 1, the LPDC decoder 160 stores decoded information in an external memory 150 that is employed by the second soft channel detector 130 during the electronic retry operation.

If the electronic retry operation fails, the hard disk drive 100 will perform a physical re-read operation. During a physical re-read operation, the head or transducer (not shown) is re-positioned over the target area to read the signal from the storage media again. While conventional physical re-read techniques read an entirely new signal from the storage media, the present invention selectively retains portions of the signal, based on a reliability metric.

Selective Data Retention During Physical Re-Read

According to one aspect of the present invention, during a physical re-read operation, the hard disk drive can selectively retain the most reliable signal segments from among multiple read operations. In one exemplary embodiment, a reliability metric is used to identify the most reliable signal segments. A reliability metric can be assigned to each signal segment for multiple read operations and the more reliable signal segments are selected by comparing the reliability metric values of each segment. In this manner, the present invention selectively retains signal segments based on a signal quality or reliability value assigned to each segment. For example, a signal segment may comprise N samples of the Y signal, such as N equal to 32 or 16 samples. According to one exemplary hard disk format, the number of samples per sector is on the order of 5,000.

Figure 2:
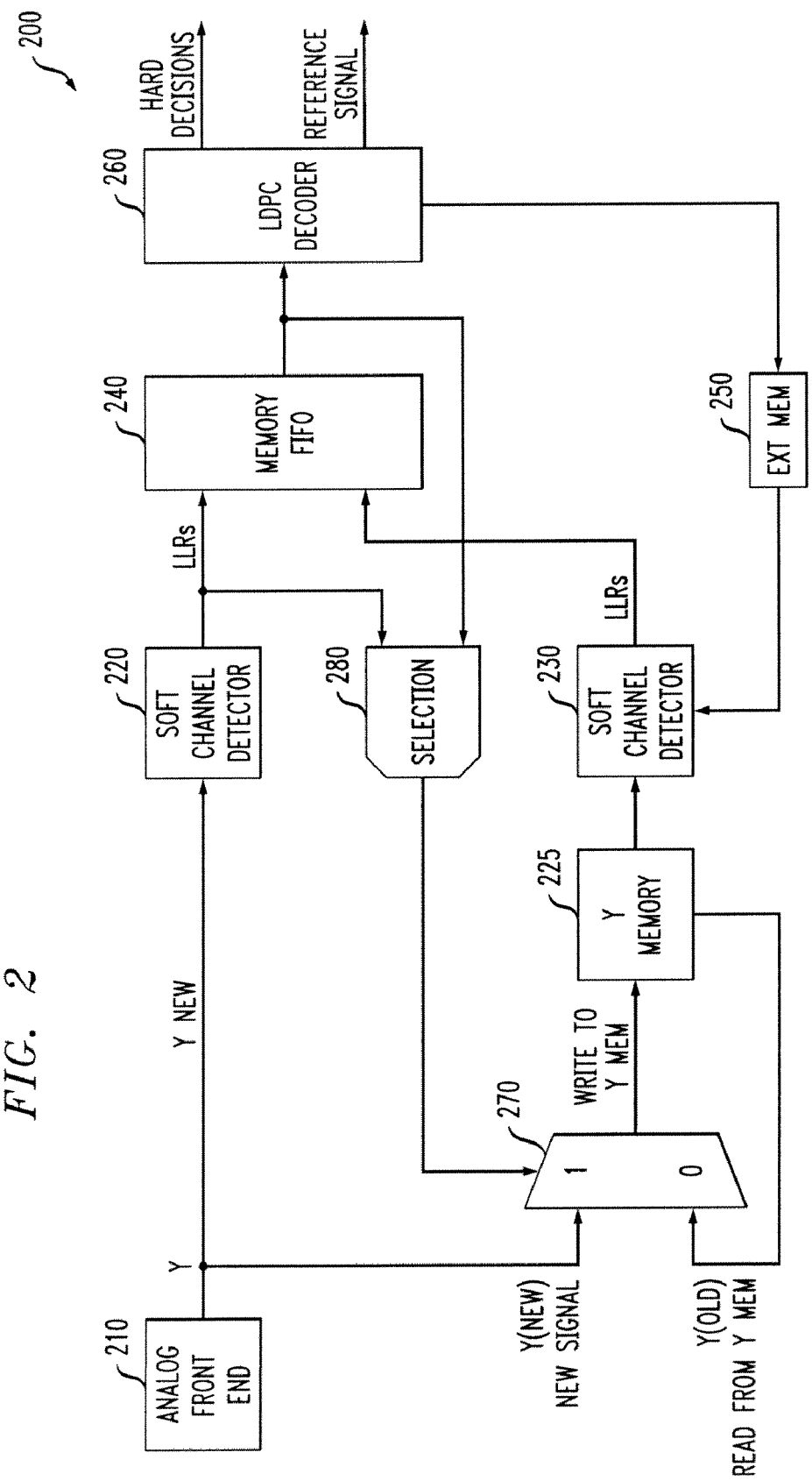
FIG. 2 is a schematic block diagram of an exemplary LDPC based iterative hard disk drive 200 incorporating features of the present invention.

FIG. 2 is a schematic block diagram of an exemplary LDPC based iterative hard disk drive 200 incorporating features of the present invention. The analog front end 210, soft channel detectors 220, 230, memories 240, 250, and LPDC decoder 260, operate in a similar manner to the corresponding elements in FIG. 1, discussed above. As shown in FIG. 2, the iterative hard disk drive 200 also includes a multiplexer 270 controlled by a selection signal generated by a selection circuit 280. The selection signal determines whether the multiplexer 270 selects a new signal, $Y_{new}$, or a retained signal, $Y_{old}$, read from the Y memory 225, based on the reliability metric assigned to the segment.

Generally, the selection signal selects the new signal segment, $Y_{new}$, or the retained signal segment, $Y_{old}$, for storage in the Y memory 225 for subsequent use based on the the reliability metric assigned to each segment. In one exemplary embodiment, after each re-read operation and for each segment in the re-read signal, the new signal, $Y_{new}$, or the retained signal, $Y_{old}$, is stored in the Y memory 225 with the corresponding reliability metric assigned to the selected segment. In this manner, the present invention selectively retains the signal segments based on the assigned reliability metric.

While the present invention is illustrated using LDPC decoding techniques, the present invention may apply to turbo codes and other iterative codes in a hard disk drive that processes soft (reliability) information in an iterative manner, as would be apparent to a person of ordinary skill in the art.

As shown in FIG. 2, the LPDC decoder 260 also generates a reference signal. Generally, the reference signal is a reliability indicator based on the noise in the signal samples. In one exemplary embodiment, the reference signal is the convolution of the hard decisions generated by the LPDC decoder 260 with the partial response target.

Exemplary Reliability Metrics

As indicated above, the reliability value assigned to each segment provides an indication of the reliability of the corresponding segment. As previously indicated, the soft channel detectors 220, 230 process the equalized samples, $Y_{New}$ or $Y_{Old}$, based on the selection signal and generate a series of reliability information for each Y sample in the form of soft bit decisions, such as LLRs. In one exemplary embodiment, the reliability value assigned to each segment can be based on the soft bit decisions or LLRs associated with each sample in the segment. For example, the reliability value, $R_{Si}$, for each segment, $S_i$, can be expressed as follows:

$R_{Si} = \Sigma abs(\text{soft bit decisions})$ or $\Sigma abs(LLR)$, where the sum is over the samples in a given segment. Generally, when based on the soft bit decisions or LLRs, the larger the reliability value, $R_{Si}$, the more reliable the segment.

In a further variation, the reliability value, $R_{Si}$, for each segment, $S_i$, can be based on the reference signal generated by the LPDC decoder 260, as follows:

$R_{Si} = \Sigma abs(Y - \text{reference signal})$, where the sum is again over the samples in a given segment and the larger the reliability value, $R_{Si}$, the less reliable the segment (since more noise indicates a less reliable signal).

As previously indicated, after each re-read operation and for each segment in the re-read signal, the new signal, $Y_{new}$, or the retained signal, $Y_{old}$, is stored in the Y memory 225 with the corresponding reliability metric assigned to the selected segment. In this manner, the present invention selectively retains the signal segments based on the assigned reliability metric. The final signal sets stored in the Y memory 225 may contain segments read in different retry attempts. After each read operation, the iterative hard disk drive 200 detects and decodes the signal based on the final set of signal segments stored in the Y memory 225.

CONCLUSION

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for reading a signal in an iterative read channel, comprising:
    obtaining an initial read signal, said read signal having a plurality of segments;
    assigning a reliability metric to each of said plurality of segments;
    repeating said obtaining and assigning steps upon detection of an error; and
    selectively retaining segments from two or more of said initial read signal and one or more repeated physical read operations based on said assigned reliability metric.

2. The method of claim 1, wherein said read signal is obtained via a physical read operation by positioning a transducer over a storage media.

3. The method of claim 1, wherein said reliability metric is assigned to each segment for a plurality of read operations and the more reliable signal segments relative to other segments are selected by comparing the reliability metric values of each segment.

4. The method of claim 1, wherein said reliability metric is based on soft bit decisions associated with a given segment.

5. The method of claim 1, wherein said reliability metric is based on log likelihood ratios associated with a given segment.

6. The method of claim 1, wherein said reliability metric is based on a noise estimation of a given segment.

7. The method of claim 6, wherein said noise estimation is obtained by subtracting a reference signal from said segments.

8. An iterative read channel, comprising:
   a selection circuit for selecting one or more segments in a read signal, each of said one or more segments having an assigned reliability metric, wherein said read signal is obtained for an initial read operation and one or more repeated physical read operations; and
   a multiplexer coupled to a memory for selectively retaining one or more segments from two or more of said initial read operation and said one or more repeated physical read operations based on said assigned reliability metric.

9. The iterative read channel of claim 8, wherein said read signal is obtained via said one or more repeated physical read operations by positioning a transducer over a storage media.

10. The iterative read channel of claim 8, wherein said reliability metric is assigned to each segment for a plurality of read operations and the more reliable signal segments relative to other segments are selected by comparing the reliability metric values of each segment.

11. The iterative read channel of claim 8, wherein said reliability metric is based on soft bit decisions associated with a given segment.

12. The iterative read channel of claim 8, wherein said reliability metric is based on log likelihood ratios associated with a given segment.

13. The iterative read channel of claim 8, wherein said reliability metric is based on a noise estimation of a given segment.

14. The iterative read channel of claim 13, wherein said noise estimation is obtained by subtracting a reference signal from said segments.

15. A method for reading a signal in an iterative read channel, comprising:
   assigning a reliability metric to each of a plurality of segments in a read signal;
   repeating said assigning step for a plurality of read operations; and
   selectively retaining said segments from two or more of an initial read operation and one or more repeated physical read operations based on said assigned reliability metric.

16. The method of claim 15, wherein said read signal is obtained via said one or more repeated physical read operations by positioning a transducer over a storage media.

17. The method of claim 15, wherein said reliability metric is based on soft bit decisions associated with a given segment.

18. The method of claim 15, wherein said reliability metric is based on log likelihood ratios associated with a given segment.

19. The method of claim 15, wherein said reliability metric is based on a noise estimation of a given segment.

20. The method of claim 19, wherein said noise estimation is obtained by subtracting a reference signal from said segments.

\* \* \* \* \*